(12) United States Patent
Teschner et al.

(10) Patent No.: US 8,828,199 B2
(45) Date of Patent: *Sep. 9, 2014

(54) SUPPORTING DEVICE FOR A MAGNETRON ASSEMBLY WITH A ROTATABLE TARGET

(75) Inventors: Goetz Teschner, Dresden (DE); Hans-Jürgen Heinrich, Großröhrsdorf (DE); Harald Grune, Dresden (DE); Sven Haehne, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 321 days.

This patent is subject to a terminal disclaimer.

(21) Appl. No.: 12/956,546

(22) Filed: Nov. 30, 2010

(65) Prior Publication Data

US 2011/0147209 A1   Jun. 23, 2011

(30) Foreign Application Priority Data

Dec. 1, 2009 (DE) .......................... 10 2009 056 241

(51) Int. Cl.
*C23C 14/34* (2006.01)
*H01J 37/34* (2006.01)

(52) U.S. Cl.
CPC ......... *C23C 14/3407* (2013.01); *H01J 37/3405* (2013.01); *H01J 37/3435* (2013.01)
USPC ................................ 204/298.22; 204/298.21

(58) Field of Classification Search
CPC .............. C23C 14/3407; H01J 37/3405; H01J 37/3435
USPC ....................... 204/298.21, 298.22
See application file for complete search history.

(56) References Cited

U.S. PATENT DOCUMENTS

| 5,096,562 | A | * | 3/1992 | Boozenny et al. | 204/298.22 |
| 5,200,049 | A | | 4/1993 | Stevenson et al. | |
| 6,736,948 | B2 | * | 5/2004 | Barrett | 204/298.22 |
| 8,506,773 | B2 | * | 8/2013 | Heinrich et al. | 204/298.21 |
| 2006/0000705 | A1 | * | 1/2006 | Hartig et al. | 204/192.12 |
| 2006/0157346 | A1 | | 7/2006 | Cnockaert et al. | |
| 2008/0012460 | A1 | | 1/2008 | Bernick et al. | |
| 2008/0105543 | A1 | * | 5/2008 | Dellaert et al. | 204/298.15 |
| 2009/0258739 | A1 | * | 10/2009 | Heinrich et al. | 474/150 |

FOREIGN PATENT DOCUMENTS

| DE | 44 05 747 A1 | 11/1994 |
| DE | 195 25 704 C1 | 7/1996 |
| DE | 10 2008 033 904 A1 | 1/2010 |
| EP | 1365436 A2 | 11/2003 |
| WO | 2006007504 A1 | 1/2006 |
| WO | 2008035965 A2 | 3/2008 |

OTHER PUBLICATIONS

Belgian Search Report and Written Opinion for BE 20100717 dated Jun. 18, 2012.

* cited by examiner

*Primary Examiner* — Rodney McDonald
(74) *Attorney, Agent, or Firm* — Heslin Rothenberg Farley & Mesiti P.C.

(57) ABSTRACT

A support device for a magnetron arrangement with a rotating target includes a housing with a drive shaft mounted to rotate in the housing. An end of the drive shaft accessible from outside of the housing connects to the rotating target and another end lies within the housing for introduction of a torque. An electric motor with a stator and a rotor is arranged within the housing to generate a torque.

15 Claims, 10 Drawing Sheets

SUPPORTING DEVICE FOR A MAGNETRON ASSEMBLY WITH A ROTATABLE TARGET

CROSS REFERENCE TO RELATED APPLICATIONS

Figure 1:
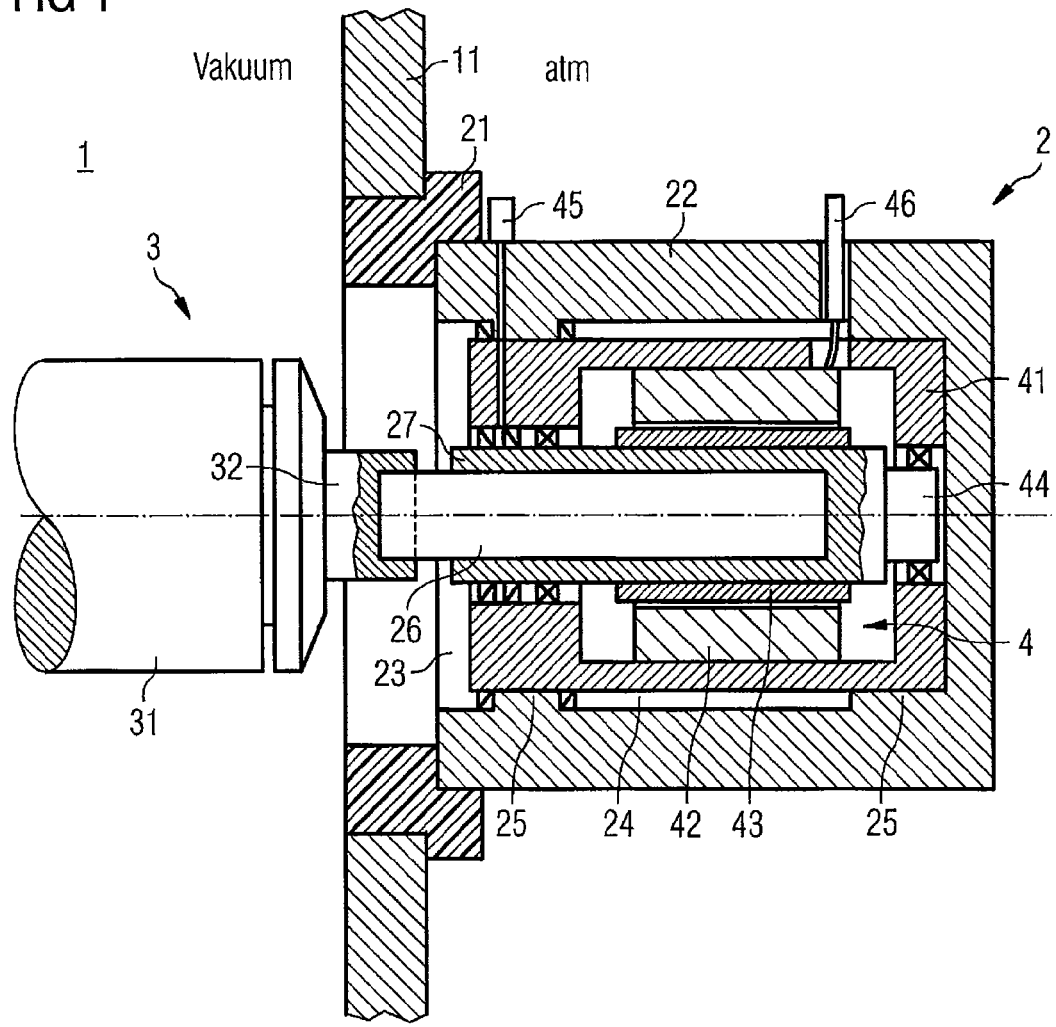

This application claims priority of German application No. 10 2009 056 241.9-54 filed on Dec. 1, 2009, the entire disclosure of which is hereby incorporated herein by reference.

BACKGROUND ART

A support device is described below for a magnetron arrangement with a rotating target, which has limited susceptibility to damage during operation with medium frequency current, i.e., in the range from a few hundred hertz to about 50 kilohertz.

Magnetron arrangements with a rotating target are known in vacuum coating technology in which a generally tubular target encloses a magnet arrangement, the tubular target being mounted rotatable and drivable so that the target material is uniformly ablated. The tubular target is ordinarily fastened in the vacuum chamber of a vacuum coating installation between two end blocks, which are designed so that they each permit rotatable mounting of the tubular target. Different functions are generally assigned to the two end blocks. One of the end blocks is ordinarily designed as a supply end block to supply the magnetron with cooling water and electrical power and the other end block as a drive end block to introduce a torque to generate rotation of the tubular target.

Known drive end blocks have an electromechanical drive device for this purpose in the form of an electric motor with transmission, which introduces the torque, for example, via bevel gears, spur gears, or cogged belts. This drive apparatus must be potential-free and therefore installed insulated relative to the target and generally also relative to the vacuum chamber. In known drive end blocks the drive device is therefore installed using insulators in the drive end block so that the electric motor is usually situated outside the vacuum chamber on the atmosphere side and a transmission or parts of a transmission or other torque transfer devices, like belt drives and the like, are arranged within the drive end block. Depending on the level of the electrical process voltage, the cost for potential separation can be very high in order to reliably achieve a situation in which the process voltage lying on the tubular target does not arc over to the drive device or vacuum chamber. An example of such an end block is known from patent application EP 1 365 436 A2.

On the other hand, a drive end block for a magnetron arrangement with a rotating target is known from DE 10 2008 033 904, which has an end block housing with a rotatably mounted drive shaft arranged in the end block housing, which is designed on its end accessible from outside of the end block housing for connection to the rotating target and which is designed on its end lying within the end block housing to introduce a torque, and includes an electric motor with a stator and a rotor for generation of a torque, the electric motor being arranged within the end block housing. According to one embodiment it can be prescribed that the electric motor is arranged coaxial to the drive shaft or/and that the torque is directly transferred to the drive shaft.

Starting from the described prior art, an improved support device is to be provided, which has low susceptibility to damage when operated with medium frequency current. End blocks, especially drive end blocks of the type described above, i.e., devices that are arranged in the interior of the vacuum chamber, but also differently configured support devices that are arranged outside the vacuum chamber on the atmosphere side are to be understood under the term support device.

BRIEF SUMMARY OF INVENTION

A support device is therefore proposed for a magnetron arrangement with a rotating target, comprising a housing with a drive shaft mounted to rotate in the housing, which is designed for indirect or direct connection to the rotating target on its end accessible from outside the housing and which is designed to introduce a torque on its end lying within the housing, the drive shaft being made from a nonconducting ceramic material.

No metallic shaft therefore protrudes from the housing as in a known end block, but only a nonconducting shaft stub, which is suitable for connection to the rotating target and is long enough so that the insulation resistance formed by the ceramic shaft stub is large enough to protect the end block and the components arranged in it from an effect by the operating current of the rotating target. The choice of the length of the shaft stub of the drive shaft extending from the housing can be calculated by one skilled in the art in the specific case depending on the voltage and current intensity in simple fashion or determined experimentally. The susceptibility to damage relative to medium frequency current in comparison with known end blocks is significantly reduced on this account.

The drive shaft is designed for direct connection to the rotating target on its end accessible from outside the housing, if the target could be directly connected to the drive shaft, i.e., if physical contact exists between the end of the drive and the target. The drive shaft, on the other hand, is designed for indirect connection to the rotating target on its end accessible from outside the housing, if an additional connection element is arranged between the target and the drive shaft, i.e., if no physical contact exists between the end of the drive and the target. Such connection elements can be spacers, adapters and similar components.

It is proposed in a modification that the ceramic drive shaft in the area lying outside the housing have a metallic sleeve element that encloses this area. A metallic sleeve element in this sense is a sleeve made of metallic material, which, however, does not protrude from the housing. The sleeve element can be open or closed on the end of the drive shaft lying within the housing. It is splined to the ceramic drive shaft so that torque transfer between the ceramic shaft and the metallic sleeve element is possible. The metallic sleeve element facilitates rotatable mounting of the drive shaft in and relative to the housing, reduces wear occurring on the seals because of friction and increases the strength of the drive shaft.

As has been common thus far, a drive device can be installed in the proposed support device so that an electric motor is situated outside the vacuum chamber on the atmosphere side and a transmission or parts of a transmission or other torque transfer devices, like belt drives and the like are arranged within the support device.

In another embodiment of the proposed support device, on the other hand, it is proposed that an electric motor with a stator and rotor to generate torque be arranged within the housing. The electric motor can then also be arranged coaxial to the drive shaft. In this case the torque can be directly transferred to the drive shaft in particularly simple fashion.

Direct transfer of torque to the drive shaft is to be understood to mean that the torque is transferred to the drive shaft free of slip and with the same direction of rotation. This can be achieved, for example, by arranging the motor shaft on which the rotor sits concentric to the drive shaft and connecting it firmly or through a clutch to the drive shaft. No transmission components are required in this case in order to transfer the torque generated by the electric motor to the drive shaft. The design of the support device is simplified relative to known solutions significantly. This simultaneously implies that the electric motor is arranged within the housing. It is understood that the electric motor must be mounted electrically insulated in the housing or/and the housing itself or/and the motor housing must be made from electrically nonconducting material.

According to another embodiment it can be proposed that a transmission be arranged between the electric motor and drive shaft, which is designed, for example, as a planetary transmission. Planetary transmissions have a compact structure and permit coaxial arrangement of the motor and drive shaft. The transmission can then be connected to the electric motor or/and to the drive shaft via a clutch or each with a clutch.

It is proposed in one embodiment that the rotor be arranged directly on the drive shaft so that the drive shaft is simultaneously the motor shaft of the electric motor. Expressed differently, the motor shaft of the electric motor in this case is simultaneously the drive shaft. A further simplification is achieved on this account because the drive shaft is no longer a separate component that must be mounted in the housing and because no connection need be made between the drive shaft and motor shaft in order to transfer the torque.

In another embodiment the electric motor is arranged in an auxiliary housing made of electrically nonconductive material and the drive shaft is mounted to rotate in the auxiliary housing. Through this expedient the cost for electrical insulation of the drive shaft is further reduced because the auxiliary housing for the drive shaft acts as an electrical insulation element relative to the housing. In this case as well the drive shaft and the motor shaft can actually be one and the same component, although this is not absolutely necessary.

It can be proposed, for example, that the rotor of the electric motor be arranged directly on the drive shaft so that the drive shaft is simultaneously the motor shaft of the electric motor. The entire drive unit can be made more compact by this.

A further simplification of the drive unit is obtained if it is prescribed that the stator of the electric motor be arranged directly on the auxiliary housing so that the auxiliary housing is simultaneously the housing of the electric motor.

It can also be prescribed that the auxiliary housing be mounted without additional fastening devices nonrotatable in receptacles of the housing provided for this purpose. This can be achieved, for example, by providing receptacles in the housing whose contours correspond exactly to those of the outside of the auxiliary housing in cross section so that the electric motor need only be pushed into these receptacles and is then mounted nonrotatable. It goes without saying that a circular cross-sectional contour is not suitable to achieve this effect. Any cross-sectional contour deviating from the circular form, for example, a square or rectangle, on the other hand, produces the described effect. For axial fastening of the electrical motor it can be expedient to provide fastening devices that prevent axial displacement of the electric motor in the receptacles of the housing. This function, however, can also be implemented by the receptacles for the auxiliary housing in the housing.

In a modification it can be prescribed that the housing has no opening to the atmosphere side. This embodiment has the advantage that vacuum sealing of the vacuum chamber is significantly facilitated. In this case continuous evacuation of the internal space of the housing necessary and common in known drive end blocks can be dispensed with. Only a current lead-through for the power supply to the electric motor is still necessary.

It can also be prescribed that the electric motor is a servomotor or/and a brushless DC motor.

The motor can also be laid out so that the stator is arranged on the inside and the rotor on the outside. The motor would then be designed as an external rotor or bell motor. In this case there can only be support directly on the rotary lead-through, which takes up all the tilting moments and support forces, or the motor shaft is passed through the stator and mounted to rotate on both sides as in an internal rotor.

BRIEF DESCRIPTION OF THE DRAWING FIGURES

Figure 2:
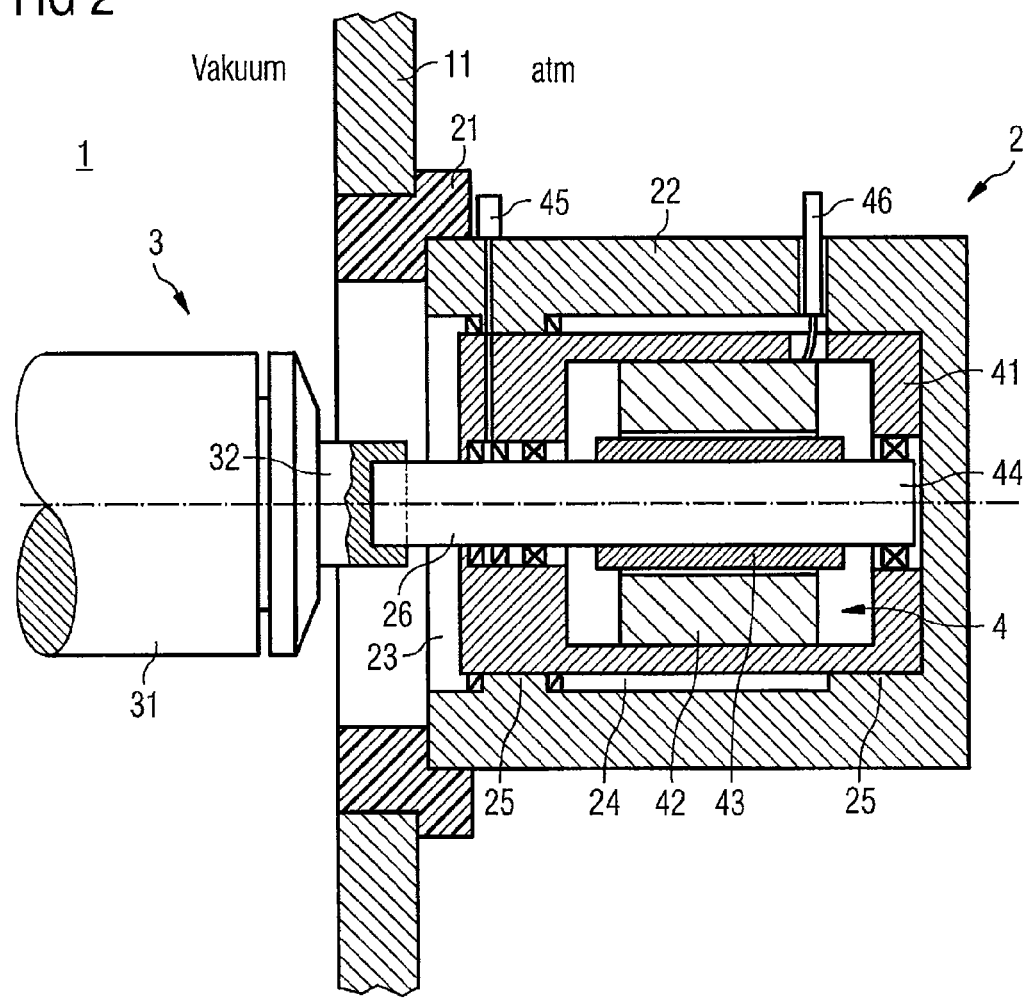
Figure 3:
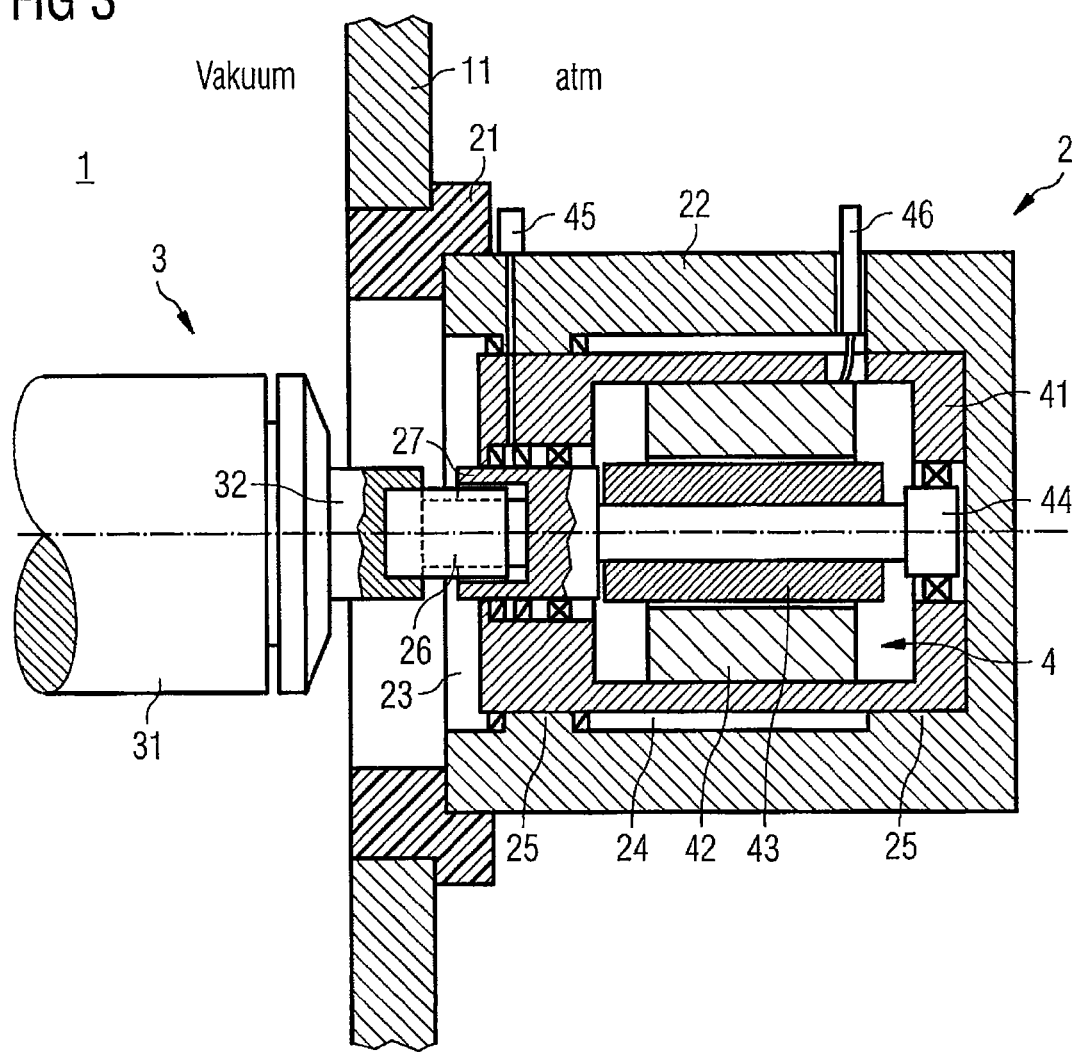
Figure 4:
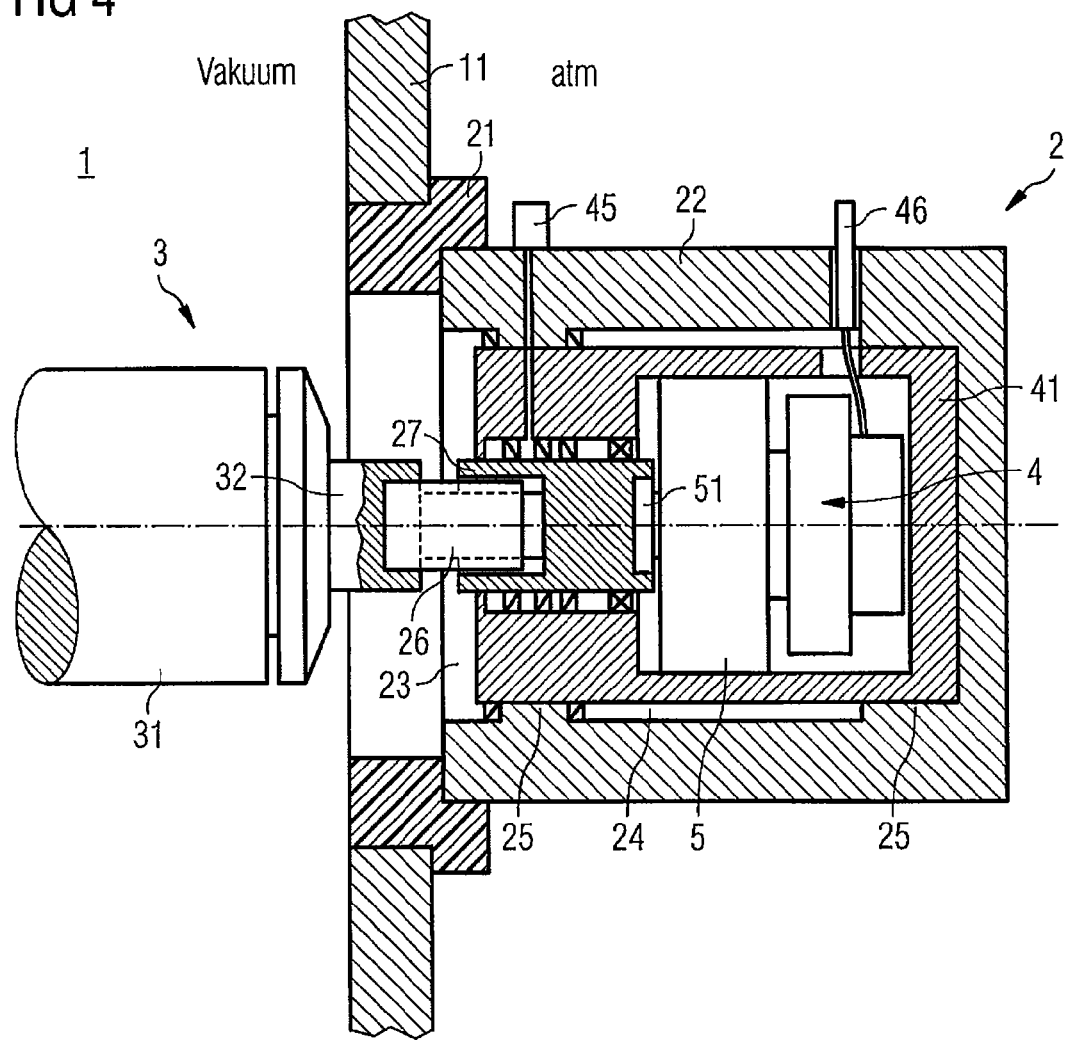
Figure 5:
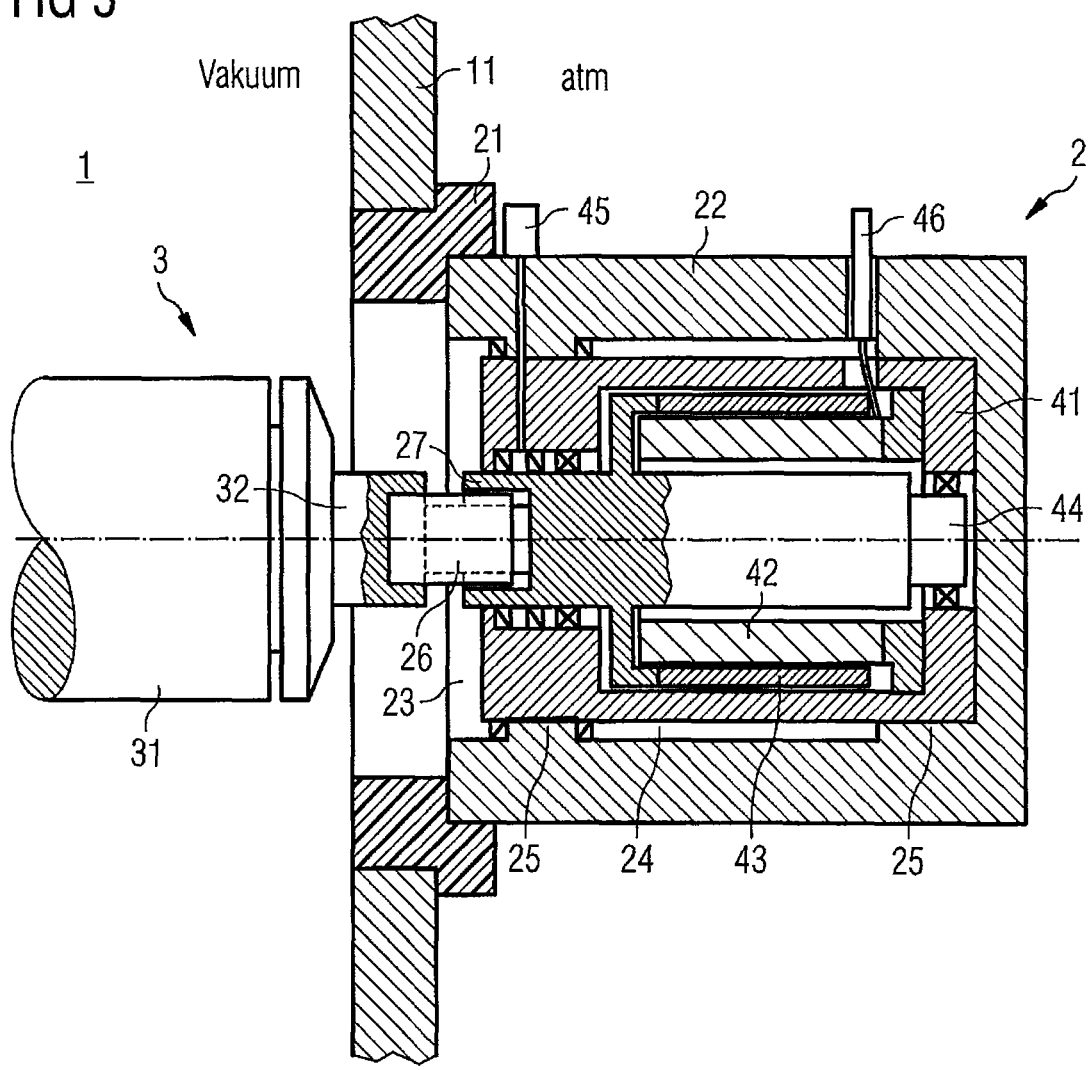
Figure 7:
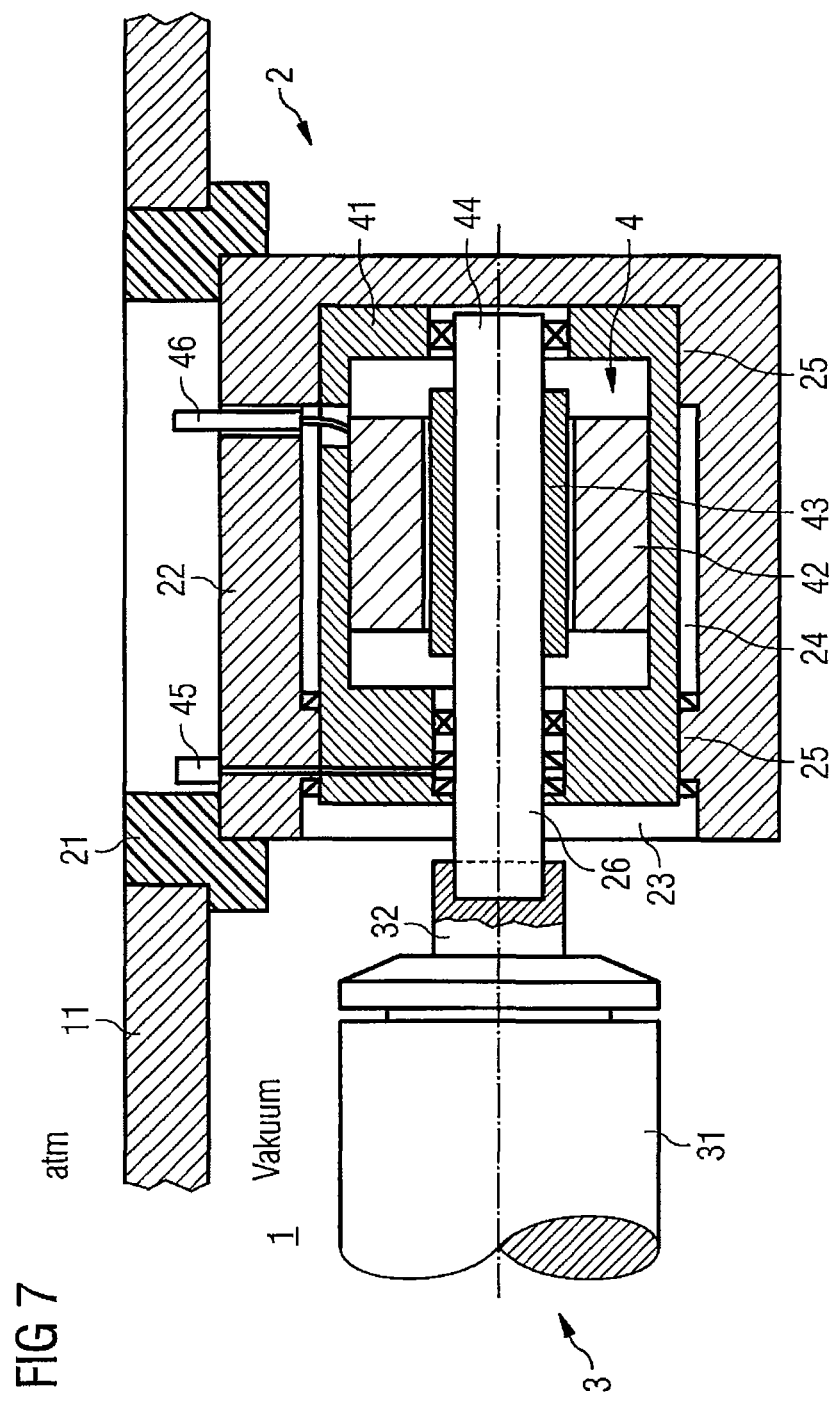
Figure 8:
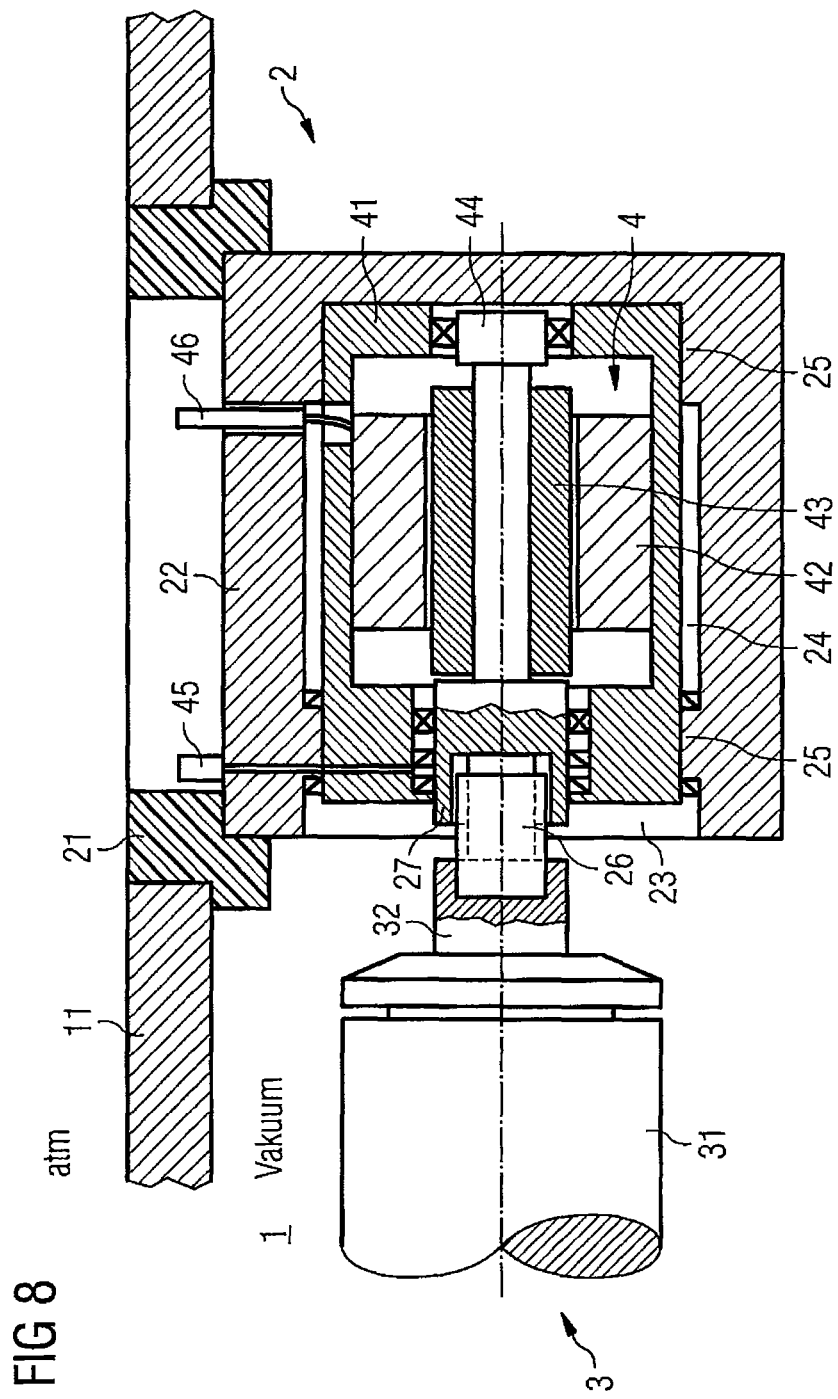
Figure 9:
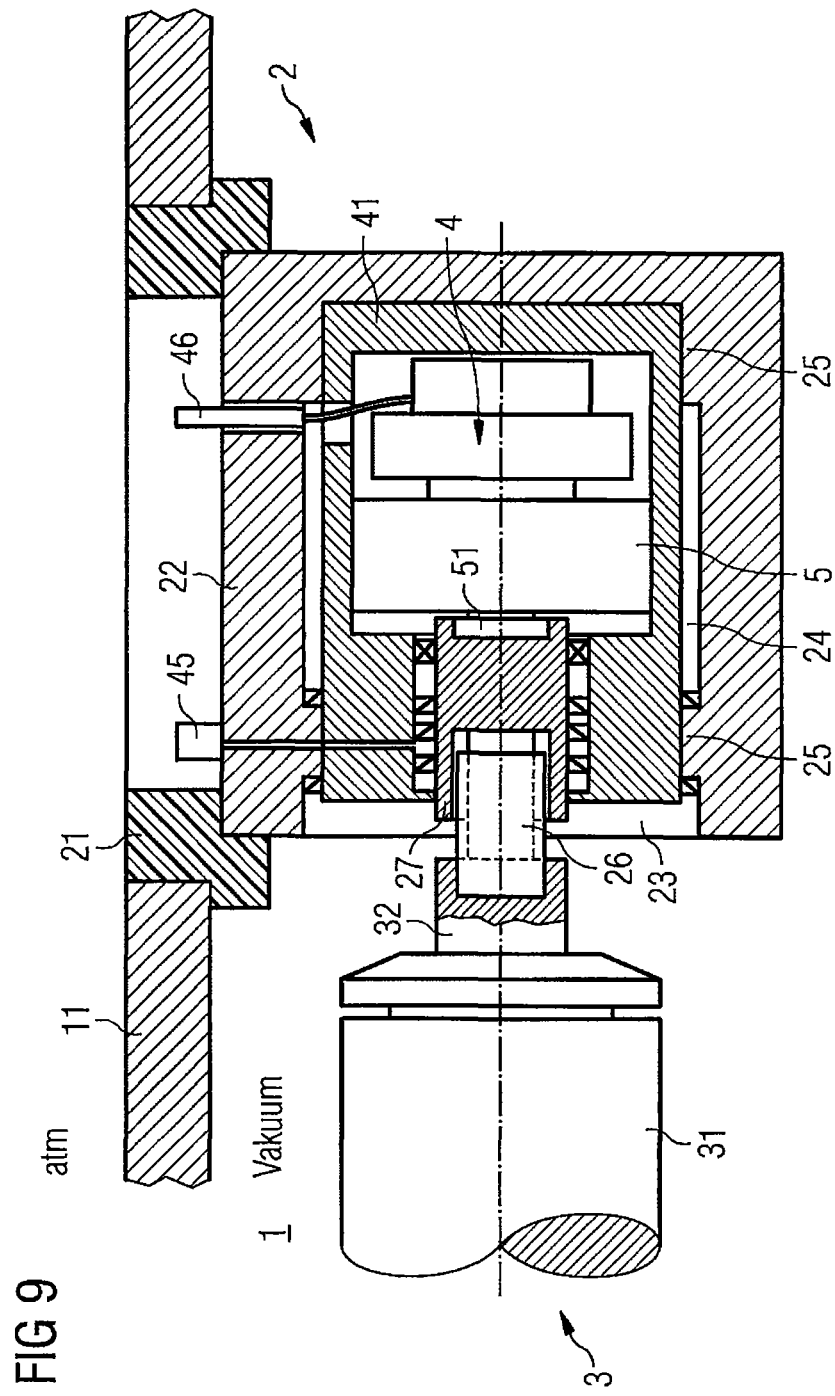
Figure 10:
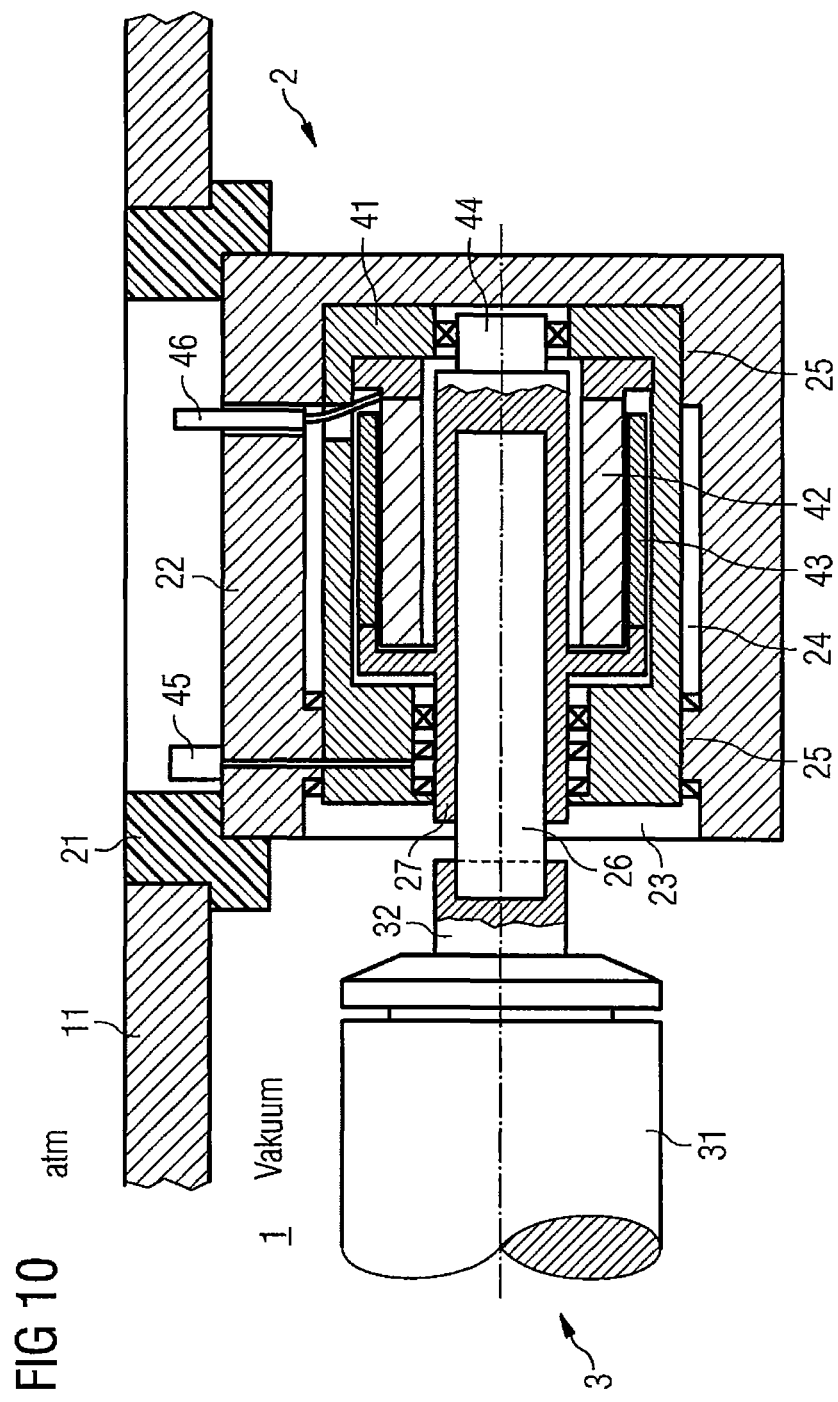

The proposed support device is further explained below with reference to practical examples and the corresponding drawings. In the drawings FIGS. 1 and 6 show a longitudinal section through a first practical example for a support device outside or inside the vacuum chamber, FIGS. 2 and 7 show a longitudinal section through a second practical example for a support device outside or inside the vacuum chamber, FIGS. 3 and 8 show a longitudinal section through a third practical example for a support device outside or inside the vacuum chamber, FIGS. 4 and 9 show a longitudinal section through a fourth practical example for a support device outside or inside the vacuum chamber, and FIGS. 5 and 10 show a longitudinal section through a fifth practical example for a support device outside or inside the vacuum chamber.

DETAILED DESCRIPTION

Figure 6:
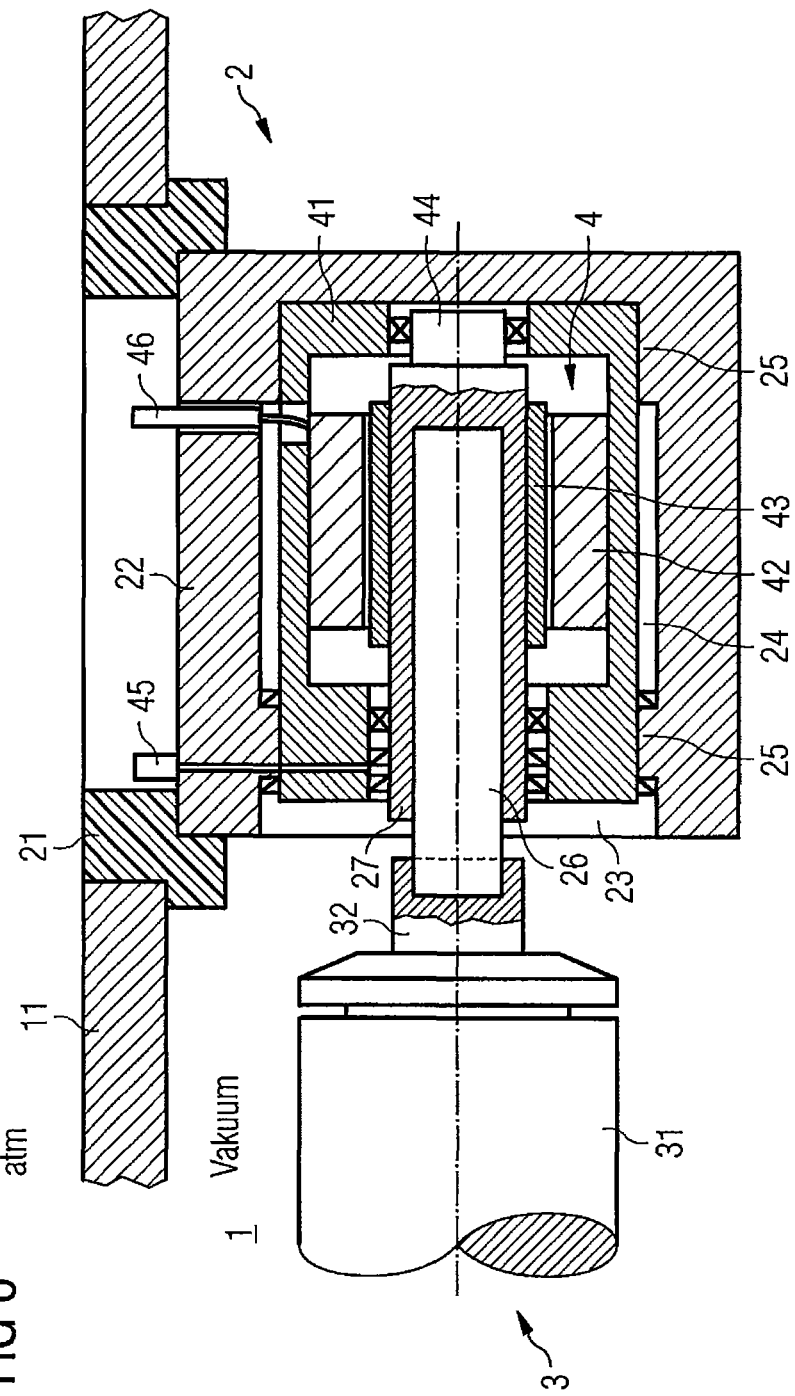

The first practical example of a support device is shown in FIGS. 1 and 6 in which the electric motor 4 is arranged within housing 22 and coaxial to drive shaft 26. A support device 2 is arranged on the chamber wall 11 of the vacuum chamber 1, to which a rotating target 3 is fastened, which has a target tube 31 and a connection piece 32, a magnet system being arranged in the interior of the target tube 31, which is not visible in the drawing. The practical example according to FIG. 1 therefore concerns a support device 2 mounted outside the vacuum chamber 1 on the atmosphere side on the chamber wall 11, while the support device 2 of the practical example according to FIG. 6 is mounted on the vacuum side within the vacuum chamber 1 on chamber wall 11.

The support device 2 is releasably fastened to a chamber wall 11 of vacuum chamber 1 by means of an insulation element 21. The support device 2 includes a housing 22 with an opening 23 facing the internal space of vacuum chamber 1, which forms a cavity 24. Two receptacles 25 for a drive unit are provided in this cavity 24, which correspond to the cross-sectional contour of the auxiliary housing 41 of the drive unit so that the drive unit can be introduced through opening 23 into cavity 24 secure from rotation.

The drive unit in the practical example includes the auxiliary housing 41, the ceramic drive shaft 26 with the metallic sleeve element 27 and the electric motor 4, which includes a stator 42 and a rotor 43. Stator 42 and rotor 43 of the electric motor 4 are arranged directly in the auxiliary housing 41 so that the electric motor 4 does not require a separate motor housing.

The auxiliary housing 41 consists of electrically insulating material. The stator 42 and the rotor 43 of the electric motor 4 are arranged in it, the rotor 43 being arranged on the motor shaft 44, which simultaneously represents the ceramic drive shaft 26 with the metallic sleeve element 27 of support device 2 and is mounted to rotate on both sides in auxiliary housing 41. The rotor 43 of the electric motor 4 in this practical example is mounted directly in the auxiliary housing 41 so that the auxiliary housing 41 of the drive unit simultaneously represents the motor housing of the electric motor 4. The end of the drive shaft 26 protruding through opening 23 of housing 22 into the interior of vacuum chamber 1 is designed for accommodation and torque transfer to the connection piece 32 of the rotating target 3.

This end of the ceramic drive shaft 26 is simultaneously mounted to rotate and sealed in the auxiliary housing 41 via the metallic sleeve element 27. A channel 45 that serves for the connection of a vacuum pump and therefore discharges outside of housing 22 discharges in the area between two seals. The power supply of the electric motor 4 occurs via a plug connector 46, which also ends outside housing 22.

A second practical example of a support device is shown in FIGS. 2 and 7 in which the electric motor 4 is arranged within housing 22 and coaxial to drive shaft 26. A support device 2 is arranged on the chamber wall 11 of the vacuum chamber 1, to which a rotating target 3 is fastened, which has a target tube 31 and a connection piece 32, a magnet system being arranged in the interior of the target tube 31, which is not visible in the drawing. The practical example according to FIG. 2 therefore concerns a support device 2 mounted outside the vacuum chamber 1 on the atmosphere side on the chamber wall 11, whereas the support device 2 of the practical example according to FIG. 7 is mounted on the vacuum side within vacuum chamber 1 on chamber wall 11.

The support device 2 is releasably fastened to a chamber wall 11 of the vacuum chamber 1 by means of an insulation element 21. The support device 2 includes a housing 22 with an opening 23 facing the internal space of vacuum chamber 1, which forms a cavity 24. Two receptacles 25 for a drive unit are provided in this cavity 24, which correspond to the cross-sectional contour of the auxiliary housing 41 of the drive unit so that the drive unit can be introduced through opening 23 to cavity 24 secure from rotation.

The drive unit in the practical example includes the auxiliary housing 41, the ceramic drive shaft 26 and the electric motor 4, which includes a stator 42 and a rotor 43. Stator 42 and rotor 43 of the electric motor 4 are arranged directly in the auxiliary housing 41 so that the electric motor 4 requires no separate motor housing.

The auxiliary housing 41 consists of electrically insulating material. The stator 42 and the rotor 43 of the electric motor 4 are arranged in it, the rotor 43 being arranged on the motor shaft 44, which simultaneously represents the ceramic drive shaft 26 of the support device 2 on this account and is mounted rotatable on both sides in auxiliary housing 41. The rotor 43 of the electric motor 4 in this practical example is mounted directly in the auxiliary housing 41 so that the auxiliary housing 41 of the drive unit simultaneously represents the motor housing of the electric motor 4. The end of the drive shaft 26 protruding through opening 23 of housing 22 into the interior of vacuum chamber 1 is designed for accommodation and torque transfer to the connection piece 32 of the rotating target 3.

This end of the ceramic drive shaft 26 is simultaneously mounted to rotate and sealed in auxiliary housing 41. In the area between two seals, a channel 45 discharges, which serves for connection of a vacuum pump and therefore discharges outside of housing 22. The power supply of the electric motor 4 occurs via a plug connector 46, which also ends outside housing 22.

A third practical example of a support device is shown in FIGS. 3 and 8 in which the electric motor 4 is arranged within housing 22 and coaxial to drive shaft 26. A support device 2 is arranged on the chamber wall 11 of a vacuum chamber 1, to which a rotating target 3 is fastened, which has a target tube 31 and a connection piece 32, a magnet system being arranged in the interior of the target tube 31, which is not visible in the drawing. The practical example according to FIG. 3 therefore concerns a support device 2 mounted outside the vacuum chamber 1 on the atmosphere side on the chamber wall 11, whereas the support device 2 of the practical example according to FIG. 8 is mounted on the vacuum side within the vacuum chamber 1 on chamber wall 11.

The support device 2 is releasably fastened to a chamber wall 11 of the vacuum chamber 1 by means of an insulation element 21. The support device 2 includes a housing 22 with an opening 23 facing the internal space of vacuum chamber 1, which forms a cavity 24. Two receptacles 25 for a drive unit are provided in this cavity 24, which correspond to the cross-sectional contour of the auxiliary housing 41 of the drive unit so that the drive unit can be introduced through opening 23 into cavity 24 secure from rotation.

The drive unit in the practical example includes the auxiliary housing 41, the ceramic drive shaft 26 and the electric motor 4, which includes a stator 42 and a rotor 43. Stator 42 and rotor 43 of the electric motor 4 are arranged directly in the auxiliary housing 41 so that the electric motor 4 requires no separate motor housing.

The auxiliary housing 41 consists of electrically insulating material. The stator 42 and the rotor 43 of the electric motor 4 are arranged in it, the rotor 43 being arranged on the motor shaft 44. The end of the motor shaft 44 directed toward the vacuum chamber is designed as a metallic sleeve element 27 in which the ceramic drive shaft 26 of the support device 2 is mounted to rotate. The rotor 43 of the electric motor 4 in this practical example is mounted directly in the auxiliary housing 41 so that the auxiliary housing 41 of the drive unit simultaneously represents the motor housing of the electric motor 4. The end of the drive shaft 26 protruding through opening 23 of housing 22 into the interior of vacuum chamber 1 is designed for accommodation and torque transfer to the connection piece 32 of the rotating target 3.

This end of the ceramic drive shaft 26 is simultaneously mounted to rotate and sealed in the auxiliary housing 41 via the metallic sleeve element 27. In the area between two seals, a channel 45 discharges, which serves for the connection of a vacuum pump and therefore discharges outside of housing 22. The power supply of the electric motor 4 occurs via a plug connector 46, which also ends outside housing 22.

A fourth practical example of a support device is shown in FIGS. 4 and 9 in which the electric motor 4 is arranged within housing 22 and coaxial to drive shaft 26. A support device 2 is arranged on the chamber wall 11 of a vacuum chamber 1, to which a rotating target 3 is fastened, which has a target tube 31 and a connection piece 32, a magnet system being arranged in the interior of the target tube 31, which is not visible in the drawing. The practical example according to FIG. 4 therefore concerns a support device 2 mounted outside the vacuum chamber 1 on the chamber wall 11 on the atmosphere side, whereas the support device 2 of the practical example according to FIG. 9 is mounted on the vacuum side within vacuum chamber 1 on chamber wall 11.

The support device 2 is releasably fastened to a chamber wall 11 of vacuum chamber 1 by means of an insulation element 21. The support device 2 includes a housing 22 with an opening 23 facing the internal space of vacuum chamber 1, which forms a cavity 24. Two receptacles 25 for a drive unit are provided in this cavity 24, which correspond to the cross-sectional contour of the auxiliary housing 41 of the drive unit so that the drive unit can be introduced through opening 23 into cavity 24 secure from rotation.

The drive unit in the practical example includes the auxiliary housing 41, the drive shaft 26 with the metallic sleeve element 27 and the electric motor 4, as well as a transmission 5 arranged between electric motor 4 and drive shaft 26, which is connected on one side to the electric motor 4 and on the other side via a clutch 51 to the metallic sleeve element 27 and therefore to the drive shaft 26. The stator and rotor of the electric motor 4 in this practical example are accommodated in their own motor housing and are therefore not directly visible in the drawing.

The auxiliary housing 41 consists of electrically insulating material. The drive shaft 26 of the support device 2 is mounted to rotate in it via the metallic sleeve element 27. The end of the drive shaft 26 protruding through opening 23 of housing 22 into the interior of vacuum chamber 1 is designed for accommodation and torque transfer to the connection piece 32 of the rotating target 3.

This end of the drive shaft 26 is simultaneously mounted to rotate and sealed in the auxiliary housing 41 via the metallic sleeve element 27. In the area between two seals, a channel 45 discharges, which serves for the connection of a vacuum pump and therefore discharges outside of vacuum chamber 1. The power supply of the electric motor 4 occurs via a plug connector 46, which also ends outside vacuum chamber 1.

A fifth practical example of a support device is shown in FIGS. 5 and 10 in which the electric motor 4 is arranged within housing 22 and coaxial to drive shaft 26. A support device 2 is arranged on the chamber wall 11 of a vacuum chamber 1, to which a rotating target 3 is fastened, which has a target tube 31 and a connection piece 32, a magnet system being arranged in the interior of the target tube 31, which is not visible in the drawing. The practical example according to FIG. 5 therefore concerns a support device 2 mounted outside the vacuum chamber 1 on the atmosphere side on the chamber wall 11, whereas the support device 2 of the practical example according to FIG. 10 is mounted on the vacuum side within vacuum chamber 1 on chamber wall 11.

The support device 2 is releasably fastened to a chamber wall 11 of the vacuum chamber 1 by means of an insulation element 21. The support device 2 includes a housing 22 with an opening 23 facing the internal space of vacuum chamber 1, which forms a cavity 24. Two receptacles 25 for a drive unit are provided in this cavity 24, which correspond to the cross-sectional contour of the auxiliary housing 41 of the drive unit so that the drive unit can be introduced through opening 23 into cavity 24 secure from rotation.

The drive unit in the practical example includes the auxiliary housing 41, the ceramic drive shaft 26 and the electric motor 4, which includes a stator 42 and a rotor 43. Stator 42 and rotor 43 of the electric motor 4 are arranged directly in the auxiliary housing 41 so that the electric motor 4 requires no separate motor housing. The electric motor 4 in this practical example is an external rotor, in which the motor shaft 44 passes through the stator 42 and is mounted to rotate on both sides as an internal rotor in the auxiliary housing 41.

The auxiliary housing 41 consists of electrically insulating material. The stator 42 and the rotor 43 of the electric motor 4 are arranged in it, the rotor 43 being arranged on the motor shaft 44. The end of the motor shaft 44 directed toward the vacuum chamber is designed as a metallic sleeve element 27 in which the ceramic drive shaft 26 of the support device 2 is mounted to rotate. The rotor 43 of the electric motor 4 in this practical example is mounted directly in the auxiliary housing 41 so that the auxiliary housing 41 of the drive unit simultaneously represents the motor housing of the electric motor 4. The end of the drive shaft 26 protruding through opening 23 of housing 22 into the interior of vacuum chamber 1 is designed for accommodation and torque transfer to the connection piece 32 of the rotating target 3.

This end of the ceramic drive shaft 26 is simultaneously mounted to rotate and sealed in the auxiliary housing 41 via the metallic sleeve element 27. In the area between two seals, a channel 45 discharges, which serves for the connection of a vacuum pump and therefore discharges outside of housing 22. The power supply of the electric motor 4 occurs via a plug connector 46, which also ends outside housing 22.

The invention claimed is:

1. Support device for a magnetron arrangement with a rotating target, comprising a main housing with a drive shaft mounted coaxially with the target and rotationally in the housing, wherein an end of the drive shaft protrudes outside of the housing, the protruding end comprising only a non-conducting shaft stub in direct or indirect connection to the rotating target, and wherein an opposite end of the drive shaft lies within the housing for introduction of a torque, and further comprising an electric motor with a stator and a rotor arranged within the housing to generate the torque and rotate the drive shaft.

2. Support device according to claim 1, wherein the electric motor is arranged coaxial to the drive shaft.

3. Support device according to claim 2, wherein the torque is transferred directly to the drive shaft.

4. Support device according to claim 1, further comprising a transmission arranged between the electric motor and the drive shaft.

5. Support device according to claim 4, wherein the transmission comprises a planetary transmission.

6. Support device according to claim 1, wherein the electric motor is arranged in an auxiliary housing made of electrically nonconducting material and the drive shaft is mounted to rotate in the auxiliary housing.

7. Support device according to claim 1, wherein the rotor of the electric motor is arranged directly on the drive shaft so that the drive shaft is simultaneously a motor shaft of the electric motor.

8. Support device according to claim 6, wherein the stator of the electric motor is arranged directly in the auxiliary housing so that the auxiliary housing is simultaneously a housing of the electric motor.

9. Support device according to claim 6, wherein the auxiliary housing is mounted without additional fastening devices secure from rotation in receptacles of the main housing.

10. Support device according to claim 1, wherein the housing has no opening to atmosphere.

11. Support device according to claim 1, wherein the electric motor comprises a servomotor.

12. Support device according to claim 1, wherein the electric motor comprises a brushless DC motor.

13. Support device according to claim 1, wherein the drive shaft comprises a nonconducting ceramic material.

14. Support device according to claim 13, wherein the drive shaft has a metallic sleeve element secured to and about the drive shaft, the metallic sleeve element not protruding beyond the housing.

15. Support device according to claim 1, wherein the main housing is located within a vacuum chamber of the magnetron arrangement.

* * * * *